(12) United States Patent
See et al.

(10) Patent No.: US 10,062,710 B2
(45) Date of Patent: Aug. 28, 2018

(54) INTEGRATED CIRCUITS WITH DEEP AND ULTRA SHALLOW TRENCH ISOLATIONS AND METHODS FOR FABRICATING THE SAME

(71) Applicant: Globalfoundries Singapore Pte. Ltd., Singapore (SG)

(72) Inventors: Guan Huei See, Singapore (SG); Rui Tze Toh, Singapore (SG); Shaoqiang Zhang, Singapore (SG); Purakh Raj Verma, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 22 days.

(21) Appl. No.: 15/151,564

(22) Filed: May 11, 2016

(65) Prior Publication Data

US 2017/0330896 A1 Nov. 16, 2017

(51) Int. Cl.
| | | |
|---|---|---|
| *H01L 21/84* | (2006.01) | |
| *H01L 27/12* | (2006.01) | |
| *H01L 29/06* | (2006.01) | |
| *H01L 29/49* | (2006.01) | |

(52) U.S. Cl.
CPC .......... *H01L 27/1203* (2013.01); *H01L 21/84* (2013.01); *H01L 29/0649* (2013.01); *H01L 29/4975* (2013.01)

(58) Field of Classification Search
CPC ............ H01L 29/0653; H01L 29/4236; H01L 29/7813; H01L 29/41766; H01L 29/7816
See application file for complete search history.

(56) References Cited

U.S. PATENT DOCUMENTS

| | | | | |
|---|---|---|---|---|
| 2010/0032729 A1* | 2/2010 | Hao | ...................... | H01L 27/098 257/272 |
| 2011/0284930 A1* | 11/2011 | Hershberger | ....... | G06F 17/5068 257/270 |
| 2012/0043608 A1* | 2/2012 | Yang | ................... | H01L 29/0653 257/336 |

* cited by examiner

*Primary Examiner* — Raj R Gupta
(74) *Attorney, Agent, or Firm* — Lorenz & Kopf, LLP

(57) ABSTRACT

Integrated circuits and methods of producing the same are provided herein. In accordance with an exemplary embodiment, an integrated circuit includes an SOI substrate with an active layer overlying a buried insulator layer that in turn overlies a handle layer. A source is defined within the active layer, and a gate well is also defined within the active layer. A first ultra shallow trench isolation extends into the active layer, where a first portion of the active layer is positioned between the first ultra shallow trench isolation and the buried insulator layer. The first ultra shallow trench isolation is positioned between the source and the gate well.

20 Claims, 6 Drawing Sheets

INTEGRATED CIRCUITS WITH DEEP AND ULTRA SHALLOW TRENCH ISOLATIONS AND METHODS FOR FABRICATING THE SAME

TECHNICAL FIELD

The technical field generally relates to integrated circuits and methods for fabricating integrated circuits, and more particularly relates to integrated circuits with deep trench isolations combined with ultra shallow trench isolations and methods for fabricating the same.

BACKGROUND

Semiconductor devices, such as field effect transistors (FETs), are the core building block of a vast majority of electronic devices. A FET includes a channel between source and drain regions, where an electrical current can flow through the channel. A metal-semiconductor field effect transistor (MESFET) uses a Schottky junction to control the resistance of the channel to current flow from the source to the drain. MESFETs are typically constructed with substrates that lack high quality surface passivation, such as gallium arsenide. MESFETs tend to be faster than metal oxide semiconductor field effect transistors (MOSFETs), but they also tend to be more expensive. MOSFETs utilize a gate insulator and a gate positioned over the channel to apply a bias to the channel and thereby control the resistance of the channel. MESFETs are useful in radio frequency applications, such as for switch and/or amplifier purposes, in part due to the higher electron mobility and lower capacitance of a MESFET compared to a MOSFET.

The materials used for MESFETs tend to be more expensive, and the materials limit scalability and higher level integration because most semiconductor devices utilize a silicon-based substrate. Junction gate field effect transistors (JFETs) are similar to a MESFET, where a JFET uses a p-n junction for the gate. In a JFET, a highly conductive material such as a metal serves as the gate terminal and directly contacts the semiconductive material of the channel (as opposed to a MOSFET where a gate insulator physically separates the channel from the electrically conductive gate.) JFETs are exclusively voltage controlled, and do not need a biasing current. A reverse bias voltage applied to the gate terminal "pinches" the channel and increases the electrical resistance between the source and drain. JFETs have been reported as having higher lateral breakdown voltage than MOSFETS, and many JFETs can operate at higher ambient temperatures, such as about 200 degrees centigrade (° C.). JFETs also tend to have higher gain and lower flicker noise than MOSFETs. Because JFETs do not include the gate insulator used in MOSFETs, JFETs avoid defects that may occur in the gate insulator of MOSFETs.

The semiconductor industry is continuously moving toward the fabrication of smaller and more complex microelectronic components with higher performance. The production of smaller integrated circuits requires the development of smaller electronic components, and closer spacing of those electronic components within the integrated circuits. The source and drain in a MOSFET are typically closer together than in a JFET, so the use of JFETs tends to increase the size of integrated circuits. In typical JFET manufacturing processes, silicide blocks are used to separate the source and the drain from the channel. The silicide block has a relatively large margin of error, and produces a relatively large gate to source (or gate to drain) distance, such as about 0.4 nanometers or more.

Accordingly, it is desirable to provide integrated circuits with JFETs and methods of producing the same. In addition, it is desirable to provide integrated circuits with JFETs having smaller dimensions, such as gate to source or gate to drain distances of about 0.4 nanometers or less. Furthermore, other desirable features and characteristics will become apparent from the subsequent detailed description and the appended claims, taken in conjunction with the accompanying drawings and this background.

BRIEF SUMMARY

Integrated circuits and methods of producing the same are provided herein. In accordance with an exemplary embodiment, an integrated circuit includes an SOI substrate with an active layer overlying a buried insulator layer that in turn overlies a handle layer. A source is defined within the active layer, and a gate well is also defined within the active layer. A first ultra shallow trench isolation extends into the active layer where a first portion of the active layer is positioned between the first ultra shallow trench isolation and the buried insulator layer. The first ultra shallow trench isolation is positioned between the source and the gate well.

An integrated circuit is provided in another exemplary embodiment. The integrated circuit includes an SOI substrate with an active layer overlying a buried insulator layer that in turn overlies a handle layer. First and second deep trench isolations extend through the active layer and contact the buried insulator layer. A source and a drain are positioned between the first and second deep trench isolations, where the source directly contacts the first deep trench isolation and the drain directly contacts the second deep trench isolation. A gate well is positioned between the source and the drain.

A method for producing an integrated circuit is provided in yet another exemplary embodiment. A first ultra shallow trench isolation is formed in an active layer of an SOI substrate, where the SOI substrate includes an active layer overlying a buried insulator layer that in turn overlies a handle layer. A first portion of the active layer is positioned between the first ultra shallow trench isolation and the buried insulator layer. A source is formed adjacent to the first ultra shallow trench isolation, and a gate well is formed adjacent to the first ultra shallow trench isolation such that the first ultra shallow trench isolation is positioned between the source and the gate well. A gate well silicide is formed in direct contact with the gate well, and a primary gate contact is formed in direct contact with the gate well silicide.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Embodiments of the present disclosure are generally directed to integrated circuits and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based integrated circuits are well-known and so, in the interest of brevity, many conventional steps will only be mentioned briefly herein or will be omitted entirely without providing the well-known process details.

In exemplary embodiments described in greater below, FETs are formed with a silicon on insulator (SOI) substrate. Exemplary FETs may utilize an ultra shallow trench isolation with underlying semiconductive material to separate a channel from a source and/or a drain, with the source and drain in electrical communication through the semiconductor material underlying the ultra shallow trench isolation. Many FETs utilize a body contact to reduce floating body effects, but JFETs formed with the ultra shallow trench isolation described above can operate without a body contact, and this reduces the footprint (area) required for the JFET. As such, the source and drain of the JFET may directly contact deep trench isolations that extend to a buried insulator layer, which eliminates the space required for the body contact.

Figure 1:
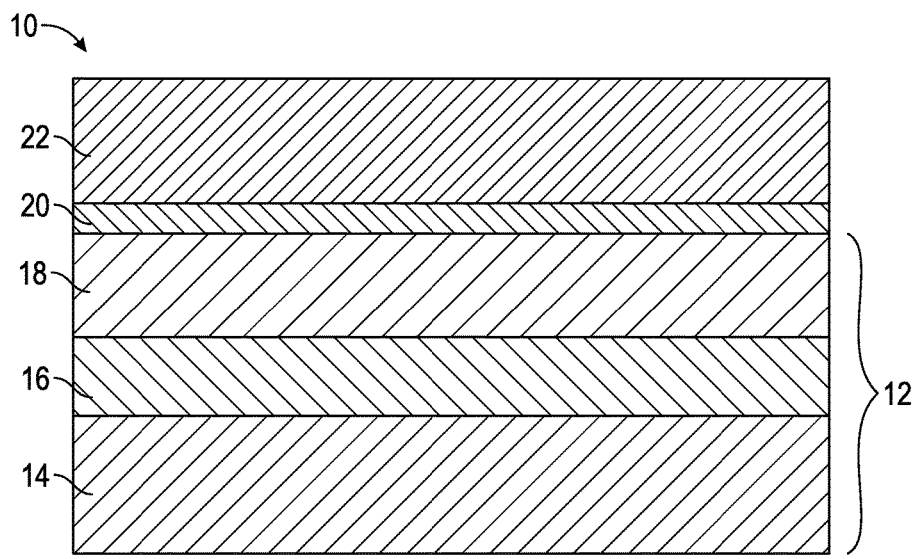
FIGS. 1-11 are cross-sectional views illustrating portions of an integrated circuit and methods for its fabrication in accordance with exemplary embodiments.

Reference is made to an exemplary embodiment illustrated in FIG. 1. An integrated circuit 10 includes a silicon on insulator substrate (SOI substrate) 12, where the SOI substrate 12 includes a handle layer 14, a buried insulator layer 16 overlying the handle layer 14, and an active layer 18 overlying the buried insulator layer 16. As used herein, the term "overlying" means "over" such that an intervening layer may lay between the active layer 18 and the buried insulator layer 16, and "on" such the active layer 18 physically contacts the buried insulator layer 16. Furthermore, the term "directly overlying" means a vertical line passing through an upper component also passes through a lower component, such that at least a portion of the upper component is directly over at least a portion of the lower component. It is understood that the integrated circuit 10 may be moved such that the relative "up" and "down" positions change, so reference to a "vertical" line means a line that is about perpendicular to a top surface of the active layer 18.

As used herein, the term "substrate materials" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the active layer 18 is a monocrystalline silicon material, but other substrate materials may be used in alternate embodiments. The active layer 18 may include conductivity determining ions at relatively low concentrations, such as from about $10^{13}$ cm$^{-3}$ to $10^{18}$ cm$^{-3}$, but other concentrations are also possible. The buried insulator layer 16 is silicon dioxide in an exemplary embodiment, but sapphire or other insulating materials may also be used. A conductive material generally has a resistivity of about $1 \times 10^{-4}$ ohm meters or less, an insulating material generally has a resistivity of about $1 \times 10^{4}$ ohm meters or more, and a semiconductive material generally has a resistivity from about $1 \times 10^{-4}$ ohm meters to about $1 \times 10^{4}$ ohm meters. The handle layer 14 provides mechanical strength and stability to the SOI substrate 12, and is monocrystalline silicon in an exemplary embodiment. However, a wide variety of other materials that provide mechanical strength and stability may be used in alternate embodiments.

A pad oxide layer 20 may be formed overlying the active layer 18. The pad oxide layer 20 may be thermally grown over the upper surface of the active layer 18, such as with an oxidizing ambient at elevated temperatures. For example, the oxidizing ambient may include oxygen and water, and the elevated temperature may be from about 900 to about 1,200 degrees centigrade (° C.). A first mask layer 22 may then be deposited overlying the pad oxide layer 20, such as with low pressure chemical vapor deposition using ammonia and dichlorosilane. As such, the first mask layer 22 may include silicon nitride. Alternate materials and production techniques may be used in different embodiments.

Figure 2:
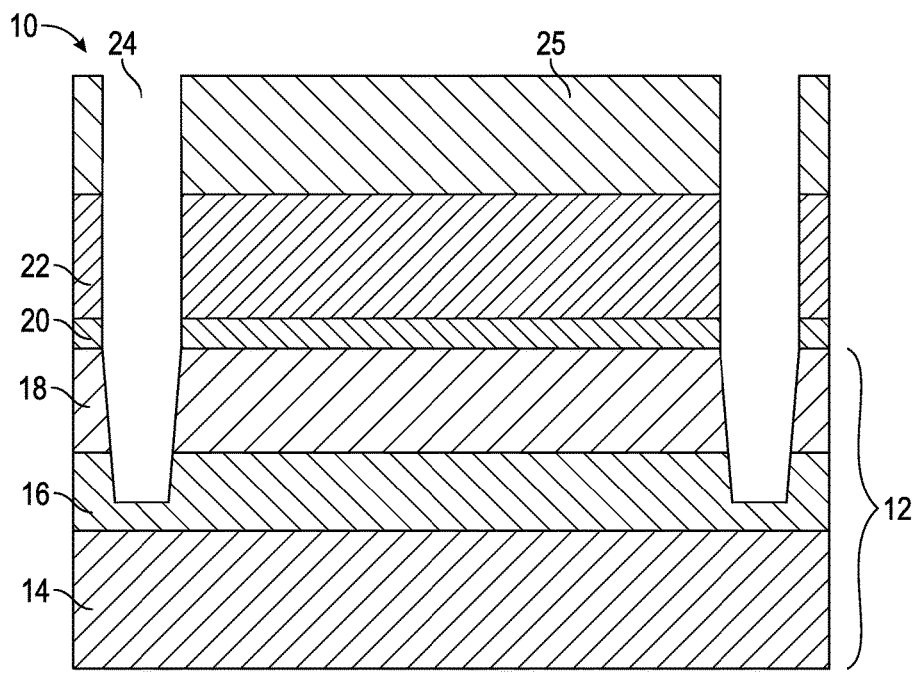

Referring to FIG. 2, a deep trench isolation opening 24 is formed through the first mask layer 22, the pad oxide layer 20, and the active layer 18. In some embodiments, the deep trench isolation opening 24 may extend into the buried insulator layer 16 for some distance, but not through the buried insulator layer 16. The deep trench isolation opening 24 may be formed using a first photoresist layer 25. The first photoresist layer 25 (as well as other photoresist layers described below) may be deposited by spin coating, and patterned by exposure to light or other electromagnetic radiation through a mask with transparent sections and opaque sections. The light causes a chemical change in the first photoresist layer 25 such that either the exposed portion or the non-exposed portion can be selectively removed. The desired locations may be removed with an organic solvent, and the first photoresist layer 25 remains overlying the other areas of the first mask layer 22. The exposed portions of the first mask layer 22, the pad oxide layer 20, and the active layer 18 may then selectively removed to form the deep trench isolation opening 24, such as with continuous or successive reactive ion etching processes. Hard mask layer(s) and/or antireflective layer(s) (not illustrated) may be used with the first photoresist layer 25. The first photoresist layer 25 may be removed after use, such as with an oxygen containing plasma, but other techniques may be used in alternate embodiments.

Figure 3:
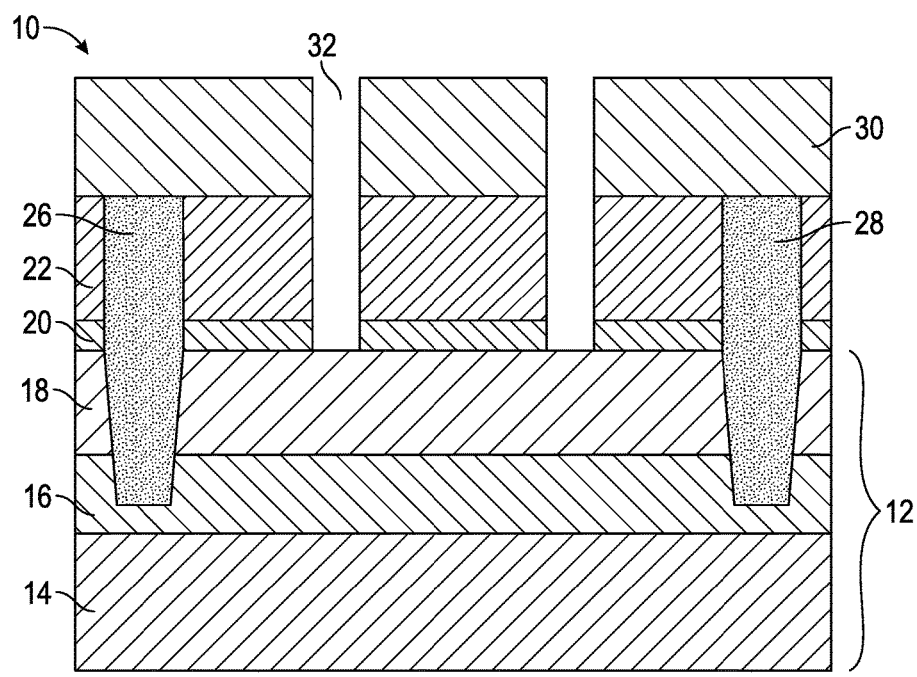

FIG. 3 illustrates an exemplary embodiment where the deep trench isolation openings 24 (illustrated in FIG. 2) are filled with an electrically insulating material. In an exemplary embodiment, the electrically insulating material may be silicon dioxide, which may be formed by chemical vapor deposition using silane and oxygen. The overburden (not illustrated) may then be removed, such as with chemical mechanical planarization, to form a first deep trench isolation 26 and a second deep trench isolation 28. A second photoresist layer 30 may then be formed overlying the first and second deep trench isolations 26, 28 and the first mask layer 22. The second photoresist layer 30 may then be patterned as described above to form an ultra shallow trench isolation opening 32. The ultra shallow trench isolation opening 32 may extend through the first mask layer 22 and the pad oxide layer 20, and terminate at the active layer 18. The ultra shallow trench isolation opening 32 may penetrate somewhat into the active layer 18 in some embodiments, but the ultra shallow trench isolation opening 32 does not extend all the way through the active layer 18. The ultra shallow trench isolation opening 32 may be formed with a reactive ion etch using an etchant selective to the material of the first mask layer 22, such as silicon hexafluoride in embodiments where the first mask layer 22 is primarily silicon nitride. The exposed portion of the pad oxide layer 20 can then be selectively removed with a wet etch using dilute hydrofluoric acid, but other techniques can also be used, such as dry etch techniques.

Figure 4:
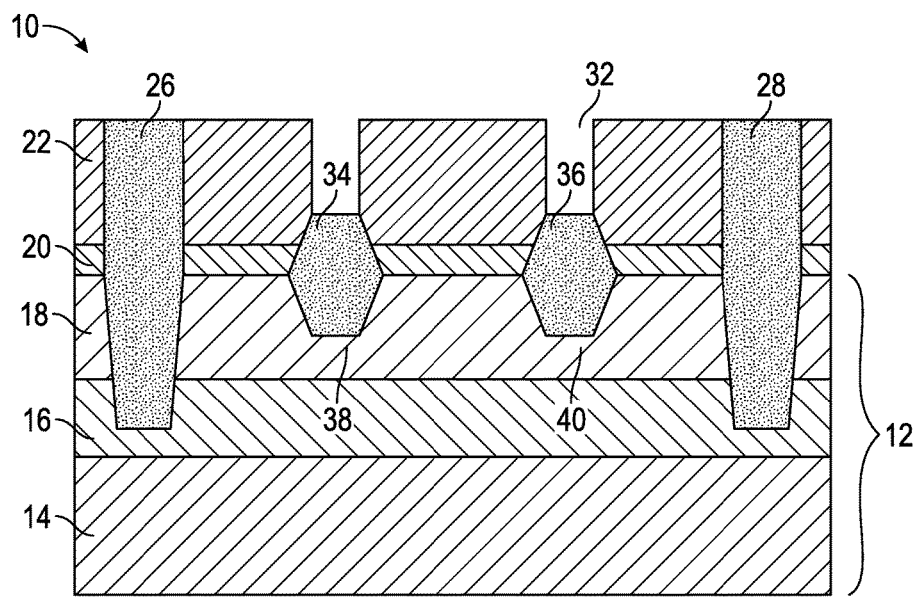

Referring to the embodiment illustrated in FIG. 4 with continuing reference to FIG. 3, the second photoresist layer 30 may be removed, as described above. A first ultra shallow trench isolation 34 and a second ultra shallow trench isolation 36 may then be formed in the active layer 18. The first and second ultra shallow trench isolations 34, 36 do not penetrate all the way through the active layer 18, so a first portion of the active layer 38 directly underlies the first ultra shallow trench isolation 34 and a second portion of the active layer 40 directly underlies the second ultra shallow trench isolation 36. As such the first and second portions of the active layer 38, 40 are positioned between the buried insulator layer 16 and the first and second ultra shallow trench isolations 34, 36, respectively. The first and second ultra shallow trench isolations may be formed by thermal oxidation. For example the integrated circuit 10 may be exposed to an oxidizing ambient at elevated temperatures, as described above, such that monocrystalline silicon within the active layer 18 is oxidized to form silicon dioxide within the first and second ultra shallow trench isolations 34, 36. In an exemplary embodiment, the first and second ultra shallow trench isolations 34, 36 may be about 800 angstroms thick, but other thicknesses are possible in alternate embodiments. In alternate embodiments, the ultra shallow trench isolation openings 32 may be formed to extend into the active layer 18, but not through the active layer 18, and an insulating material may be deposited within the ultra shallow trench isolation openings 32 to form the first and second ultra shallow trench isolations 34, 36. In alternate embodiments, the first and second ultra shallow trench isolations 34, 36 may be formed before the first and second deep trench isolations 26, 28, or the shallow and deep trench isolation openings 32, 24 may be filled simultaneously to form the first and second ultra shallow trench and deep trench isolations 26, 28, 34, 26.

Figure 5:
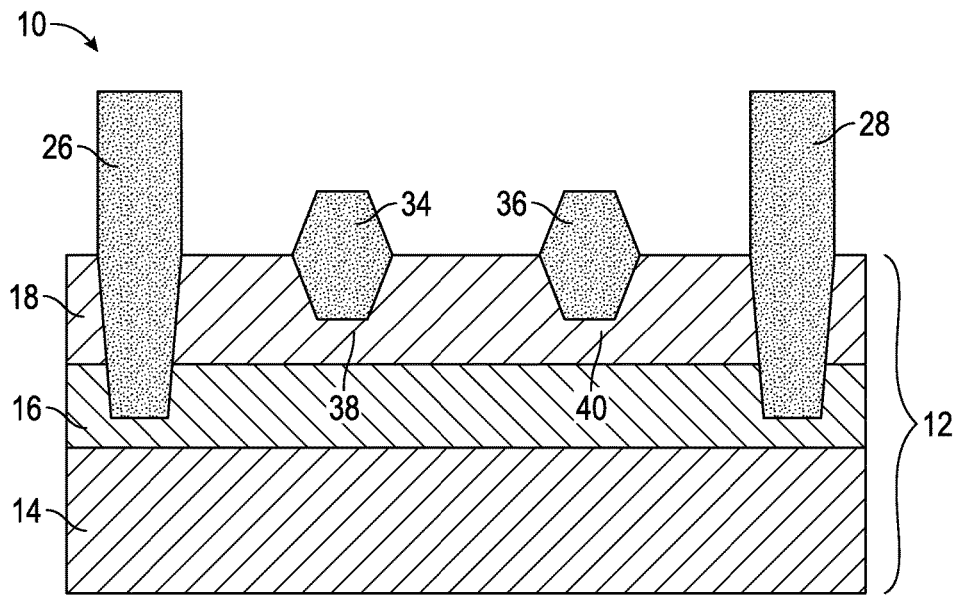

The first mask layer 22 and the pad oxide layer 20 may be removed after the first and second ultra shallow trench isolations 34, 36 are formed, as illustrated in an exemplary embodiment in FIG. 5 with continuing reference to FIG. 4. Any topography or raised portions may first be removed with chemical mechanical planarization, and then the first and second deep trench and ultra shallow trench isolations 26, 28, 34, 36 may be removed to a level above the surface of the active layer 18, such as with a selective wet etch using dilute hydrofluoric acid. In embodiments where the first mask layer 22 primarily includes silicon nitride and the pad oxide layer 20 primarily includes silicon dioxide, the first mask layer 22 may then be removed with a wet etch using hot phosphoric acid wash and the pad oxide layer 20 may be removed with another wet etch using dilute hydrofluoric acid. The pad oxide layer 20 may be quite thin, such as about 80 angstroms thick. Some material may be removed from the first and second deep trench and ultra shallow trench isolations 26, 28, 34, 36 during removal of the pad oxide layer 20, but the losses may be minimal because the pad oxide layer 20 is much thinner than any of the first and second deep trench and ultra shallow trench isolations 26, 28, 34, 36. Furthermore, material losses of the portions of the first and second deep trench and ultra shallow trench isolations 26, 28, 34, 36 that extend above the surface of the active layer 18 have an immaterial impact on the function of the integrated circuit 10. Removal of the pad oxide layer 20 may expose a top surface of the active layer 18, and a sacrificial oxide layer (not illustrated) may optionally be formed overlying the top surface of the active layer 18 in some embodiments.

A field effect transistor (FET) may then be formed in the area between the first and second deep trench isolations 26, 28 using standard complementary metal oxide semiconductor techniques. As such, MOSFETs and other integrated circuit components may be made at the same time as the FET positioned between the first and second deep trench isolations 26, 28, so the process described herein does not increase manufacturing costs significantly. Many different techniques may be used to form the FET, but one exemplary process will be described below with the understanding that multiple variations are possible.

Figure 6:
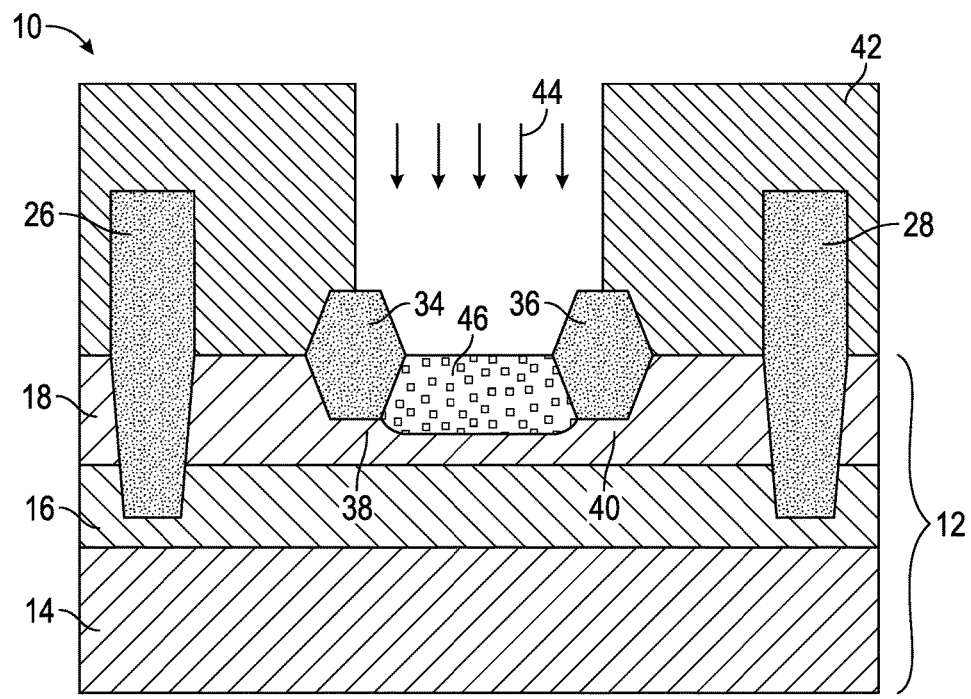

Referring to the exemplary embodiment in FIG. 6, a third photoresist layer 42 is formed overlying the active layer 18. The third photoresist layer 42 is patterned as described above to expose the active layer 18 between the first and second ultra shallow trench isolations 34, 36 while covering the active layer 18 between the first deep and ultra shallow trench isolations 26, 34 and between the second deep and ultra shallow trench isolations 28, 36. Gate conductivity determining ions 44 may then be implanted into the exposed active layer 18 between the first and second ultra shallow trench isolations 34, 36 to form a gate well 46 within the active layer 18. In an exemplary embodiment, the gate well 46 is formed by implanting "P" type conductivity determining ions (sometimes referred to as dopants) into the active layer 18. "P" type conductivity determining ions include boron, aluminum, gallium, and indium, but other materials or combinations of materials can also be used, and different components may be implanted with the same or different "P" type conductivity-determining ions in various embodiments. In alternate embodiments the gate conductivity determining ions 44 may be "N" type conductivity determining ions, where "N" type conductivity determining ions include arsenic or phosphorous, but antimony, other materials, or combinations thereof can also be used, and different components may be implanted with the same or different "N" type conductivity determining ions in various embodiments.

The conductivity determining ions in the gate well 46 are the opposite type as in the active layer 18, so embodiments with "P" type conductivity determining ions in the gate well 46 include "N" type conductivity determining ions in the active layer 18 and vice versa. The concentration of conductivity determining ions in the gate well 46 is also higher than the concentration of conductivity determining ions in the active layer 18. The gate well 46 may serve to influence the conductivity of the underlying active layer 18, so that the active layer 18 underlying the gate well 46 may serve as a channel.

In some embodiments, ion implantation involves ionizing the conductivity determining ions (dopant ions) and shooting the dopant ions into the active layer 18 under the influence of an electrical field. The gate well 46 is then annealed to repair crystal damage from the ion implantation process, to electrically activate the dopants, and to redistribute the dopants. The annealing process can use widely varying temperatures, such as temperatures ranging from about 500° C. to about 1,200° C. The third photoresist layer 42 may be removed after the gate conductivity determining ions 44 are implanted.

Figure 7:
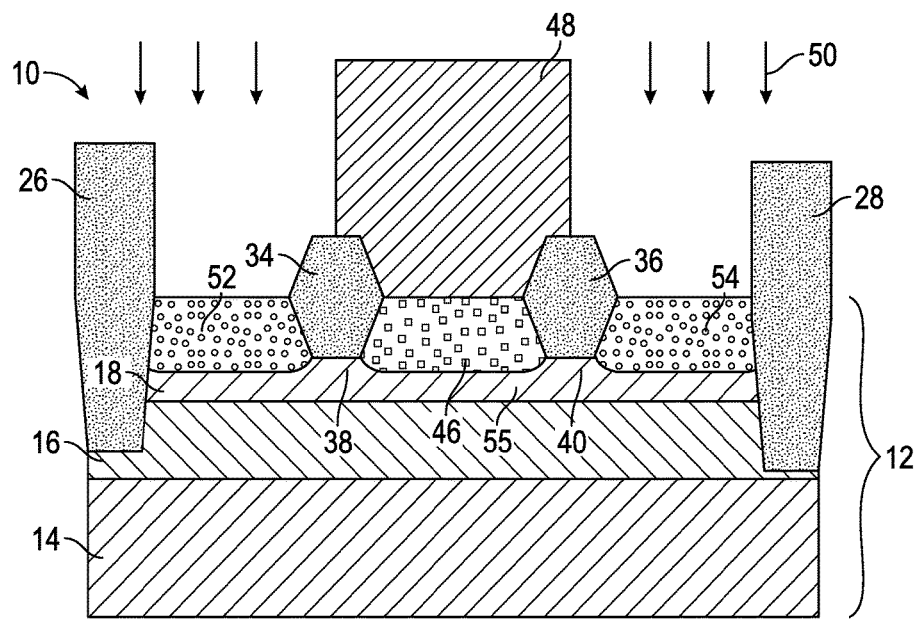

Referring to an exemplary embodiment illustrated in FIG. 7, a fourth photoresist layer 48 is formed and patterned to expose the active layer 18 between the first deep trench isolation 26 and the first ultra shallow trench isolation 34, and between the second deep trench isolation 28 and the second ultra shallow trench isolation 36. The photoresist covers the gate well 46. Source/drain conductivity determining ions 50 may then be implanted into the exposed portions of the active layer 18 to form a source 52 and a drain 54 within the active layer 18. The source/drain conductivity determining ions 50 are opposite of the gate conductivity determining ions 44 illustrated in FIG. 6, so if the gate conductivity determining ions 44 are "P" type, the source/drain conductivity determining ions 50 are "N" type, and vice versa. As such, the source/drain conductivity determining ions 50 are the same type of conductivity determining ion in the active layer 18, but the concentration of conductivity determining ions is higher in the source 52 and the drain 54 than in the active layer 18.

The first and second ultra shallow trench isolations 34, 36 serve to block ion implantation into the underlying active layer 18, so the first and second portions of the active layer 38, 40 generally have a lower concentration of conductivity determining ions than the gate well 46, the source 52, or the drain 54. The portion of the active layer 18 underlying the gate well 46 may serve as a channel 55 positioned between the source 52 and the drain 54, as typical for field effect transistors. The active layer 18 underlying: (i) the source 52; (ii) the first and second ultra shallow trench isolations 34, 36 (the first and second portions of the active layer 38, 40); (iii) the gate well 46 (the channel 55); and (iv) the drain 54 may have lower concentrations of conductivity determining ions relative to the source 52, the drain 54, and the gate well 46, as mentioned above. Therefore, these portions of the active layer 18 may serve as an N-well or a P-well, depending on the type of conductivity determining ions present. In a similar manner, varying dopant implantation techniques may be used to form lightly doped source or drain areas, double doped source or drain areas, and many other types of doped areas used in various integrated circuit components.

In the illustrated embodiment, the source 52 extends from the first deep trench isolation 26 to the first ultra shallow trench isolation 34, the drain extends from the second deep trench isolation 28 to the second ultra shallow trench isolation 36, and the gate well 46 extends from the first ultra shallow trench isolation 34 to the second ultra shallow trench isolation 36. As such, there is no area remaining between the first and second deep trench isolations 26, 28 for a body contact (not illustrated), so this embodiment may be free of a body contact. MOSFET performance is often compromised by a "floating body effect," so a body contact is typically used to reduce or eliminate that floating body effect. However, many JFETs are capable of proper operation without a body contact. The lack of a body contact provides a device with a smaller footprint. Furthermore, the first and second ultra shallow trench isolations 34, 36 often have a smaller width than a silicide block (not illustrated) that is typically used for JFETs production, so the structure described above further reduces the footprint compared to a similar device using silicide blocks in place of the first and second ultra shallow trench isolations 34, 36. In an exemplary embodiment, a source distance 51 measured between the source 52 and the gate well 46 may be about 0.2 nanometers or less, and a drain distance 53 measured between the drain 54 and the gate well 46 may also be about 0.2 nanometers or less.

Figure 8:
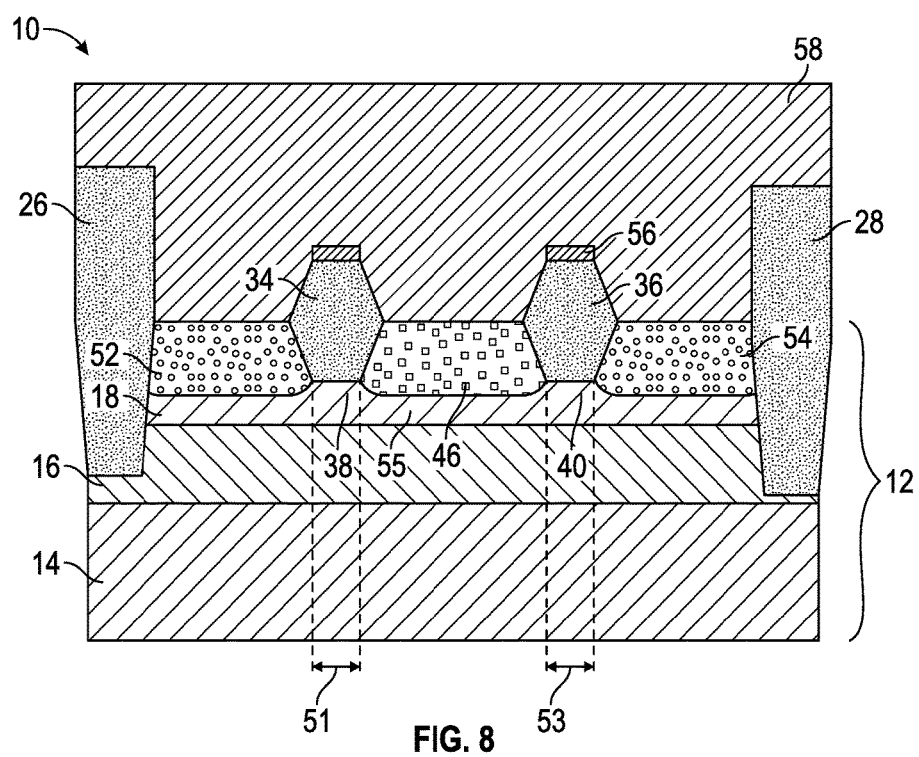

In an optional embodiment, a USTI gate may be formed overlying the first and/or second ultra shallow trench isolation 34, 36. Referring to FIG. 8, a gate insulator 56 may be formed directly overlying the first and/or second ultra shallow trench isolations 34, 36, where the gate insulator 56 is an electrical insulator such as silicon dioxide. In an exemplary embodiment, an insulating material is deposited overlying the first and second deep trench and ultra shallow trench isolations 26, 28, 34, 36, the source 52, the drain 54, and the gate well 46, and then the insulating material is removed from the source 52, the drain 54, the gate well 46 and optionally the first and second deep trench isolations 26, 28 to produce the gate insulator 56 directly overlying the first and/or second ultra shallow trench isolations 34, 36. The insulating material may be removed by lithographically covering selected areas and selectively etching the insulating material in the areas that are exposed to leave the gate insulator 56 directly overlying the first and/or second ultra shallow trench isolations 34, 36, as described above. A gate layer 58 may then be formed overlying the gate insulator 56 and other areas. The gate layer 58 may be polysilicon with conductivity determining ions at a sufficient concentration to provide a desired level of electrical conductivity. Polysilicon may be formed by low pressure chemical vapor deposition in a silane environment. However, other materials and techniques may be used in alternate embodiments, such as replacement metal gate techniques.

Figure 9:
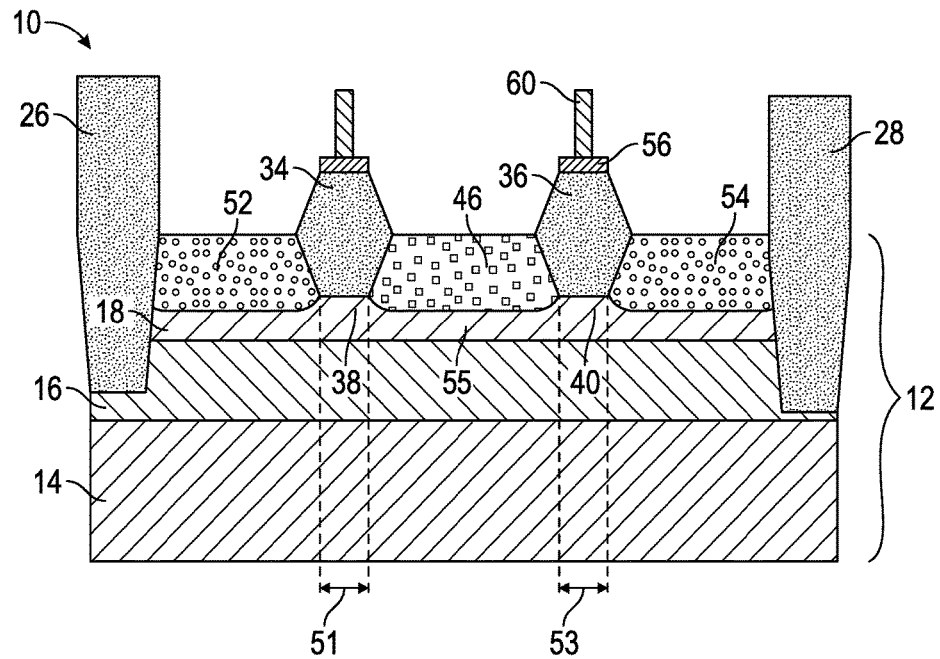

Referring to an exemplary embodiment in FIG. 9, much of the gate layer 58 illustrated in FIG. 8 is removed to form a USTI gate 60 directly overlying the gate insulator 56 and the first and second ultra shallow trench isolations 34, 36. A photoresist layer (not illustrated) can be formed and patterned to lithographically cover the USTI gate 60, and the other exposed portions of the gate layer 58 may then be removed, such as with a reactive ion etch using hydrogen bromide. The USTI gate 60 may help block unwanted implants more efficiently than just the first and/or second ultra shallow trench isolations 34, 36, and the USTI gate 60 may provide additional bias to further modulate the region under the first and/or second ultra shallow trench isolations 34, 36 to further optimize device performance.

Figure 10:
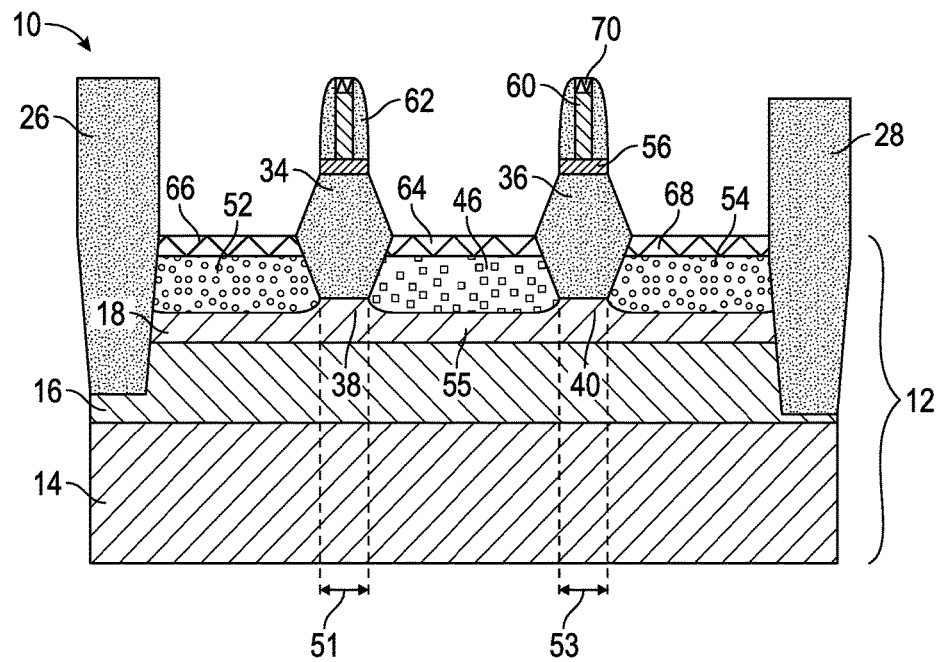

Reference is made to the exemplary embodiment in FIG. 10. Spacers 62 may be formed adjacent to the USTI gate 60 in direct contact with a side surface of the USTI gate 60. The spacers 62 may be formed by blanket depositing silicon nitride followed by an anisotropic etch of the deposited silicon nitride, which leaves the vertical portions adjacent to the USTI gate 60 in place as the spacers 62. Silicon nitride may be deposited by low pressure chemical vapor deposition using ammonia and silane, and a dry plasma etch with hydrogen and nitrogen trifluoride will anisotropically remove the silicon nitride. Silicides are then formed at a top surface of the gate well 46, the source 52, the drain 54, and the USTI gate 60 to form a gate well silicide 64, a source silicide 66, a drain silicide 68, and a USTI gate silicide 70, respectively. The gate well silicide 64, the source silicide 66, the drain silicide 68, and the gate silicide 70 overlie and directly contact the gate well 46, the source 52, the drain 54, and the USTI gate 60, respectively, as the silicides are formed in part from the material of the underlying structure. In an exemplary embodiment, a thin layer of metal is deposited on the exposed surfaces, such as by sputtering or chemical vapor deposition, and the silicides are formed by a subsequent anneal. In an exemplary embodiment, nickel (Ni) is deposited and then annealed at a first temperature of about 240° C. to about 320° C. for about 10 to about 40 seconds, followed by a second anneal at about 400° C. to about 500° C. for about 20 to about 40 seconds. Other metals can be used, and the annealing process is adjusted for the selected metal. A wet etch is then used to selectively remove the nickel overburden, which does not react with materials other than silicon. For example, nickel can be selectively etched with a mixture of nitric acid, acetic acid, and sulfuric acid.

Figure 11:
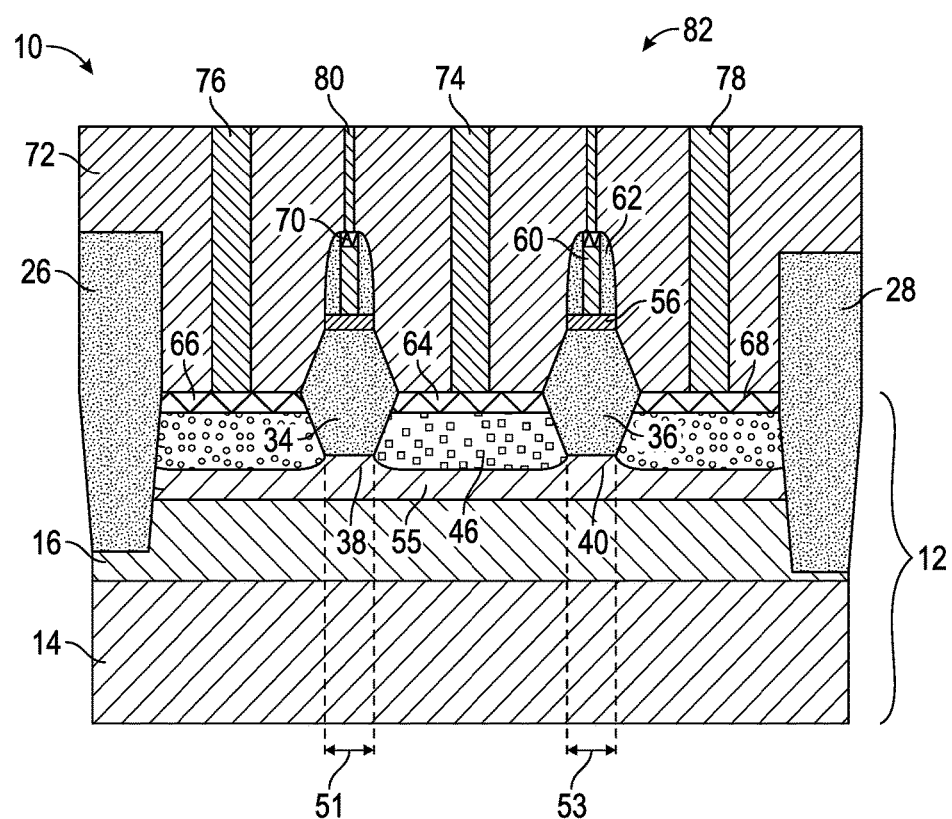

In an exemplary embodiment, an interlayer dielectric 72 is then deposited overlying the silicides and other components, as illustrated in FIG. 11. The interlayer dielectric 72 is an electrically insulating material, such as silicon dioxide, which may be deposited by chemical vapor deposition using silane and oxygen, but several other materials or techniques may be used in alternate embodiments. A plurality of contacts are then formed through the interlayer dielectric 72, including: a primary gate contact 74 in electrical communication with the gate well 46; a source contact 76 in electrical communication with the source 52; a drain contact 78 in electrical communication with the drain 54; and a secondary gate contact 80 in electrical communication with the USTI gate 60. The term "electrical communication," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductors, but not electrical insulators. As such, in the illustrated embodiment, the primary gate contact 74 is in direct electrical contact with the gate well silicide 64, and the gate well silicide 64 is in direct electrical contact with the gate well 46. In a similar manner, the source silicide 66 is in direct electrical contact with the source 52 and with the source contact 76, the drain silicide 68 is in direct electrical contact with the drain 54 and with the drain contact 78, and the gate silicide 70 is in direct electrical contact with the USTI gate 60 and the secondary gate contact 80. As such, the primary gate contact 74 is in electrical communication with the gate well 46, and no electrical insulator separates the primary gate contact 74 and the gate well 46. As such, the source 52, drain 54, and gate well 46 form a JFET 82.

The contacts may be formed by lithographically exposing the interlayer dielectric 72 and selectively etching a plurality of vias (not illustrated.) The vias are then filled to form the contacts. In an exemplary embodiment, the contacts (including the primary gate contact 74, the source contact 76, the drain contact 78, the secondary gate contacts 80, and optionally other contacts) include an adhesion layer, a barrier layer, and a plug (not individually illustrated), which are sequentially deposited. For example, an adhesion layer of titanium may be formed by low pressure chemical vapor deposition using titanium pentachloride, a barrier layer of titanium nitride may be formed by chemical vapor deposition using titanium tetrabromide and ammonia, and a plug of tungsten may be formed by chemical vapor deposition using tungsten hexafluoride and hydrogen. Other types of contacts are also possible, such as copper or other conductive materials. The USTI gates 60 overlying the first and/or second ultra shallow trench isolations 34, 36 may be electrically grounded or tied to the primary gate contact 74 to further reduce the capacitance of the JFET 82.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. An integrated circuit comprising:
    an SOI substrate comprising an active layer, a buried insulator layer, and a handle layer, wherein the active layer overlies the buried insulator layer, and the buried insulator layer overlies the handle layer;
    a source defined within the active layer;
    a gate well defined within the active layer;
    a first ultra shallow trench isolation extending into the active layer, wherein a first portion of the active layer is positioned between the first ultra shallow trench isolation and the buried insulator layer, and wherein the first ultra shallow trench isolation is positioned between the source and the gate well;
    a gate insulator directly overlying the first ultra shallow trench isolation, wherein the gate insulator is an electrical insulator; and
    a USTI gate directly overlying the gate insulator.

2. The integrated circuit of claim 1 further comprising a gate well silicide directly contacting the gate well.

3. The integrated circuit of claim 2 further comprising:
    a primary gate contact directly contacting the gate well silicide.

4. The integrated circuit of claim 1 further comprising:
    a second ultra shallow trench isolation extending into the active layer, wherein a second portion of the active layer is positioned between the second ultra shallow trench isolation and the buried insulator layer, and wherein the gate well is positioned between the first ultra shallow trench isolation and the second ultra shallow trench isolation.

5. The integrated circuit of claim 4 further comprising:
    a drain defined within the active layer, wherein the second ultra shallow trench isolation is positioned between the drain and the gate well.

6. The integrated circuit of claim 4 further comprising:
    a drain defined within the active layer;
    a first deep trench isolation extending through the active layer and contacting the buried insulator layer, wherein the source directly contacts the first deep trench isolation and the first ultra shallow trench isolation; and
    a second deep trench isolation extending through the active layer and contacting the buried insulator layer; wherein the drain directly contacts the second deep trench isolation and the second ultra shallow trench isolation.

7. The integrated circuit of claim 6 wherein the active layer comprises an N well positioned between the first deep trench isolation and the second deep trench isolation, wherein the gate well overlies the N well.

8. The integrated circuit of claim 1 wherein the source comprises "N" type conductivity determining ions.

9. The integrated circuit of claim 8 wherein the gate well comprises "P" type conductivity determining ions.

10. The integrated circuit of claim 1 further comprising:
    a gate well silicide directly contacting the gate well;
    a primary gate contact directly contacting the gate well silicide; and wherein a source distance between the source and the gate well is about 0.2 nanometers or less.

11. The integrated circuit of claim 1 further comprising:
a source silicide overlying the source, wherein the source silicide directly contacts the source; and
a source contact directly contacting the source silicide.

12. The integrated circuit of claim 1 wherein the gate insulator directly overlying the first ultra shallow trench isolation is a different component than the first ultra shallow trench isolation.

13. The integrated circuit of claim 1 further comprising:
a spacer adjacent to the USTI gate;
a source contact in electrical communication with the source;
a primary gate contact in electrical communication with the gate well; and
an interlayer dielectric, wherein the interlayer dielectric is positioned between the source contact and the spacer, and wherein the interlayer dielectric is positioned between the gate contact and the spacer.

14. An integrated circuit comprising:
an SOI substrate comprising an active layer, a buried insulator layer, and a handle layer, wherein the active layer overlies the buried insulator layer, and the buried insulator layer overlies the handle layer;
a first deep trench isolation extending through the active layer and contacting the buried insulator layer;
a second deep trench isolation extending through the active layer and contacting the buried insulator layer;
a source positioned between the first deep trench isolation and the second deep trench isolation, wherein the source directly contacts the first deep trench isolation;
a drain positioned between the first deep trench isolation and the second deep trench isolation, wherein the drain directly contacts the second deep trench isolation;
a gate well positioned between the source and the drain;
a first ultra shallow trench isolation extending into the active layer, wherein a first portion of the active layer is positioned between the first ultra shallow trench isolation and the buried insulator layer, and wherein the first ultra shallow trench isolation is positioned between the gate well and the source;
a gate insulator directly overlying the first ultra shallow trench isolation, wherein the gate insulator is an electrical insulator; and
a USTI gate directly overlying the gate insulator.

15. The integrated circuit of claim 14 further comprising a gate well silicide directly connected to the gate well.

16. The integrated circuit of claim 15 further comprising:
a primary gate contact directly contacting the gate well silicide.

17. The integrated circuit of claim 14 further comprising:
a spacer adjacent to the USTI gate;
a source contact in electrical communication with the source; and
an interlayer dielectric, wherein the interlayer dielectric is positioned between the source contact and the spacer.

18. The integrated circuit of claim 14 further comprising:
a second ultra shallow trench isolation extending into the active layer, wherein a second portion of the active layer is positioned between the second ultra shallow trench isolation and the buried insulator layer, and wherein the second ultra shallow trench isolation is positioned between the gate well and the drain.

19. The integrated circuit of claim 14 wherein:
the gate insulator directly overlying the first ultra shallow trench isolation is a different component than the first ultra shallow trench isolation.

20. A method of producing an integrated circuit comprising:
forming a first ultra shallow trench isolation in an active layer of an SOI substrate, wherein the SOI substrate comprises a buried insulator layer underlying the active layer, and wherein a first portion of the active layer is positioned between the first ultra shallow trench isolation and the buried insulator layer;
forming a source adjacent to the first ultra shallow trench isolation;
forming a gate well adjacent to the first ultra shallow trench isolation such that the first ultra shallow trench isolation is positioned between the source and the gate well;
forming a gate well silicide directly contacting the gate well;
forming a primary gate contact directly contacting the gate well silicide;
forming a gate insulator directly overlying the first ultra shallow trench isolation, wherein the gate insulator is an electrical insulator; and
forming a USTI gate directly overlying the gate insulator.

* * * * *